United States Patent [19]

Beilstein, Jr. et al.

[11] Patent Number: 5,426,566
[45] Date of Patent: Jun. 20, 1995

[54] MULTICHIP INTEGRATED CIRCUIT PACKAGES AND SYSTEMS

[75] Inventors: Kenneth E. Beilstein, Jr., Essex Center; Claude L. Bertin, South Burlington; Howard L. Kalter, Colchester; Gordon A. Kelley, Jr., Essex Junction; Christopher P. Miller, Underhill; Dale E. Pontius, Colchester; Willem B. van der Hoeven, Underhill; Steven Platt, Essex Junction, all of Vt.

[73] Assignee: International Business Machines Corporation, Armonk, N.Y.

[21] Appl. No.: 826

[22] Filed: Jan. 4, 1993

Related U.S. Application Data

[63] Continuation of Ser. No. 768,137, Sep. 30, 1991, abandoned.

[51] Int. Cl.⁶ ............................................. H05K 7/00
[52] U.S. Cl. .................................... 361/735; 257/686; 257/777; 361/820; 437/208; 437/915
[58] Field of Search .......................... 257/686, 777; 361/729–731, 735, 784, 785, 790, 792, 793; 437/51, 208, 915; 439/68, 47, 69

[56] References Cited

U.S. PATENT DOCUMENTS 2,907,926 10/1959 Slack ............................. 361/396

(List continued on next page.)

FOREIGN PATENT DOCUMENTS

| | | | |
|---|---|---|---|
| 0206696 | 12/1986 | European Pat. Off. | 357/75 |
| 58-103149 | 6/1983 | Japan | 357/75 |
| 59-205747 | 11/1984 | Japan . | |
| 61-35547 | 2/1986 | Japan . | |
| 61-168951 | 7/1986 | Japan | 357/75 |
| 62-16535 | 1/1987 | Japan | 357/75 |
| 63-186457 | 8/1988 | Japan | 357/75 |
| 1-53440 | 3/1989 | Japan | 357/75 |
| 2-17644 | 1/1990 | Japan | 357/75 |
| 2-36554 | 2/1990 | Japan | 357/75 |
| 2-207562 | 8/1990 | Japan | 357/75 |
| 89/04113 | 5/1989 | WIPO | 437/207 |
| WO93/23873 | 5/1993 | WIPO . | |

OTHER PUBLICATIONS

IEEE Transactions On Computers "Batch-Fabricated Three-Dimensional Planar Coaxial Interconnections For Microelectronic Systems" vol. C-20 No. 5 5/71.

IBM Disclosure Bulletin "High-Density Packaging Of Monolithic Circuits" by Agusta et al. vol. 10 No. 7 12/67.

Electronic Hybrid Systems by W. A. Brotherton 1292 Und-Oder-Nor+Steuerungstechnik 14 (1984) No. 9 Mainz Deutschland Stoller, "Edge-Mounted Chip Assembly for Microprocessors", IBM Technical Disclosure Bulletin, vol. 23, No. 2, pp. 581-582, 1980.

Carson, "Unconventional focal-plane architecture (FPA)", SPIE IR Image Sensor Technology, vol. 225, pp. 34-37, 1980.

*Primary Examiner*—Leo P. Picard
*Assistant Examiner*—Donald A. Sparks
*Attorney, Agent, or Firm*—Heslin & Rothenberg

[57] ABSTRACT

Multichip integrated circuit packages and systems of multichip packages having reduced interconnecting lead lengths are disclosed. The multichip package includes a multiplicity of semiconductor chip layers laminated together in a unitized module. A first metallization pattern is connected to the integrated circuit chips on at least one side surface of the unitized module. In addition, at least one end surface of the module contains a second metallization pattern which is configured to facilitate connection of the package to an external signal source, such as another multichip package. The system includes at least two such packages which are electrically coupled via either metallization patterns provided on the end surface of the packagers. If required, a plurality of multichip packages can be directly coupled into the system in an analogous manner. Further specific details of the multichip package and the system of multichip packages are set forth herein.

21 Claims, 4 Drawing Sheets

5,426,566
Page 2

U.S. PATENT DOCUMENTS

| | | | |
|---|---|---|---|
| 3,029,495 | 4/1962 | Doctor | 29/155.5 |
| 3,065,384 | 11/1962 | Sprude | 361/395 |
| 3,070,729 | 12/1962 | Heidler | 361/395 |
| 3,139,559 | 6/1964 | Heidler | 361/395 |
| 3,152,288 | 10/1964 | Mittler | 361/396 |
| 3,370,203 | 2/1968 | Kravitz et al. | 361/396 |
| 3,746,934 | 7/1973 | Stein | 361/396 |
| 3,748,479 | 7/1979 | Lehovec | 250/208 |
| 4,441,629 | 11/1985 | Carson et al. | 250/578 |
| 4,520,427 | 5/1985 | Brotherton et al. | 361/396 |
| 4,525,921 | 7/1985 | Carson et al. | 29/577 C |
| 4,638,348 | 1/1987 | Brown et al. | 357/74 |
| 4,706,166 | 11/1987 | Go | 361/403 |
| 4,727,410 | 2/1988 | Higgins, III | 357/74 |
| 4,764,846 | 8/1988 | Go | 361/388 |
| 4,794,042 | 12/1988 | Solomon | 437/51 |
| 4,801,992 | 1/1989 | Golubic | 357/40 |
| 4,833,568 | 5/1989 | Berhold | 361/396 |
| 4,862,249 | 8/1989 | Carlson | 357/80 |
| 4,868,712 | 9/1989 | Woodman | 361/396 |
| 4,894,706 | 1/1990 | Sato et al. | 357/52 |
| 4,901,136 | 2/1990 | Neugebauer et al. | 357/75 |
| 4,926,241 | 5/1990 | Carey | 357/75 |
| 4,956,746 | 9/1990 | Gates, Jr. et al. | 361/396 |
| 4,983,533 | 1/1991 | Go | 361/388 |
| 5,016,138 | 5/1991 | Woodman | 361/396 |
| 5,019,943 | 5/1991 | Fasslender et al. | 361/396 |
| 5,019,946 | 5/1991 | Eichelberger et al. | 361/396 |
| 5,051,865 | 9/1991 | Kato | 357/75 |
| 5,104,820 | 4/1992 | Go et al. | 437/51 | fig. 1
(PRIOR ART)

fig. 2 fig. 3 fig. 4 fig. 5

MULTICHIP INTEGRATED CIRCUIT PACKAGES AND SYSTEMS

This application is a continuation of application Ser. No. 07/768,137, filed Sep. 30, 1991, now abandoned.

BACKGROUND OF THE INVENTION

1. Technical Field

The present invention relates in general to high density electronic packaging which permits optimization of the number of circuit elements to be included in a given volume, while still allowing easy interconnect with other portions of a system. More particularly, the present invention relates to multiple laminated chip packages and to combinations of multichip packages in single systems or subsystems.

2. Description of the Prior Art

Advances in state of the art electronics technology, and in particular technology associated with integrated circuits, continue to provide steady improvement in the cost and performance of electronic circuits, particularly in the digital electronics and computer related fields. The complexity of integrated circuits has increased substantially in the years since such circuits were first developed and it is not unusual today for multiple integrated circuit chips to be combined into a single laminated chip package. A continuing goal in the art is to provide integrated circuit packages which facilitate the high density mounting of integrated circuit devices. For example, the speed of operation of VHSIC and VLSI devices is often adversely effected by the length of interconnecting leads between respective integrated circuit devices. Thus, it is advantageous to package a plurality of devices in high density to provide the shortest possible interconnection lead configurations. Long lead lengths can produce unwanted inductance noise, capacitive loading effects, along with increased signal propagation times and signal skews. Thus, a primary consideration in developing improved high density electronic packaging is the length of the various leads interconnecting the integrated circuit components in the system. The invention described herein is directed to this consideration and significantly improves upon the state of the multichip packaging art.

SUMMARY OF THE INVENTION

Briefly described, the present invention comprises in one aspect a multichip integrated circuit package which is configured for electrical connection to an external signal circuit. The package includes a plurality of integrated circuit chips which are connected in the form of a unitized module. The package has at least one side surface and at least one end surface. At least some of the plurality of integrated circuit chips have conductive leads extending to at least one side surface of the module. The package further includes a first metallization pattern disposed on the module's side surface for electrically connecting at least some of the chip leads extending thereto. Further, one or both of the end surfaces has a second metallization pattern disposed thereon which is configured for facilitating electrical connection between the multichip package and the external signal circuit. In certain specific embodiments, the first and second metallization patterns are electrically coupled, and the integrated circuit chip in the stack adjacent to either end surface of the module with the second metallization pattern thereon comprises an active chip.

In another aspect of the present invention, an interconnected system of multiple multichip integrated circuit packages is disclosed. In a basic embodiment of the system, a first multichip integrated circuit package and a second multichip integrated circuit package are provided. The first multichip package has a plurality of integrated circuit chips connected to form a unitized first module which has at least one side surface and at least one end surface. At least some of the plurality of integrated circuit chips in the first module include conductive leads extending to the side surface thereof. The first multichip package further includes a first metallization pattern disposed on the first module's side surface for electrically connecting at least some of the chip leads extending thereto, and may have a second metallization pattern disposed on at least one end surface.

Similarly, the second package includes a plurality of integrated circuit chips which are connected to form a unitized second module having at least one side surface and at least one end surface. At least some of the plurality of integrated circuit chips therein include conductive leads extending to the side surface of the second module. The second multichip package further includes a first metallization pattern disposed on the second module's side surface for electrically connecting at least some of the chip leads extending thereto, and may include a second metallization pattern disposed on at least one of the end surfaces thereof. The first package and the second package are electrically connected via the metallization patterns on the end surface of at least one of the packages to form the system of integrated circuit packages. Additional specific details of the system are described and claimed herein, including the incorporation of additional integrated circuit chip packages into the system.

The present invention advantageously provides a multichip package and a system of multichip packages having reduced connecting lead lengths between integrated circuit chips and, therefore, reduced lead inductance noise, capacitive loading effects, signal propagation delays and signal skews. With the package and system approach presented herein, drivers and receivers can be physically placed closer to each other than with any previously known technique. Further, depending upon the implementation, first level package leads, circuit boards, card to card wiring and associated sockets can all be eliminated. Also, the prior art multiplicity of connectors/joints can be replaced with a single type of connection, e.g., solder bumps, which can reduce manufacturing complexity and costs while improving package/system yield and reliability.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

DETAILED DESCRIPTION OF A SPECIFIC EMBODIMENT

Figure 1:
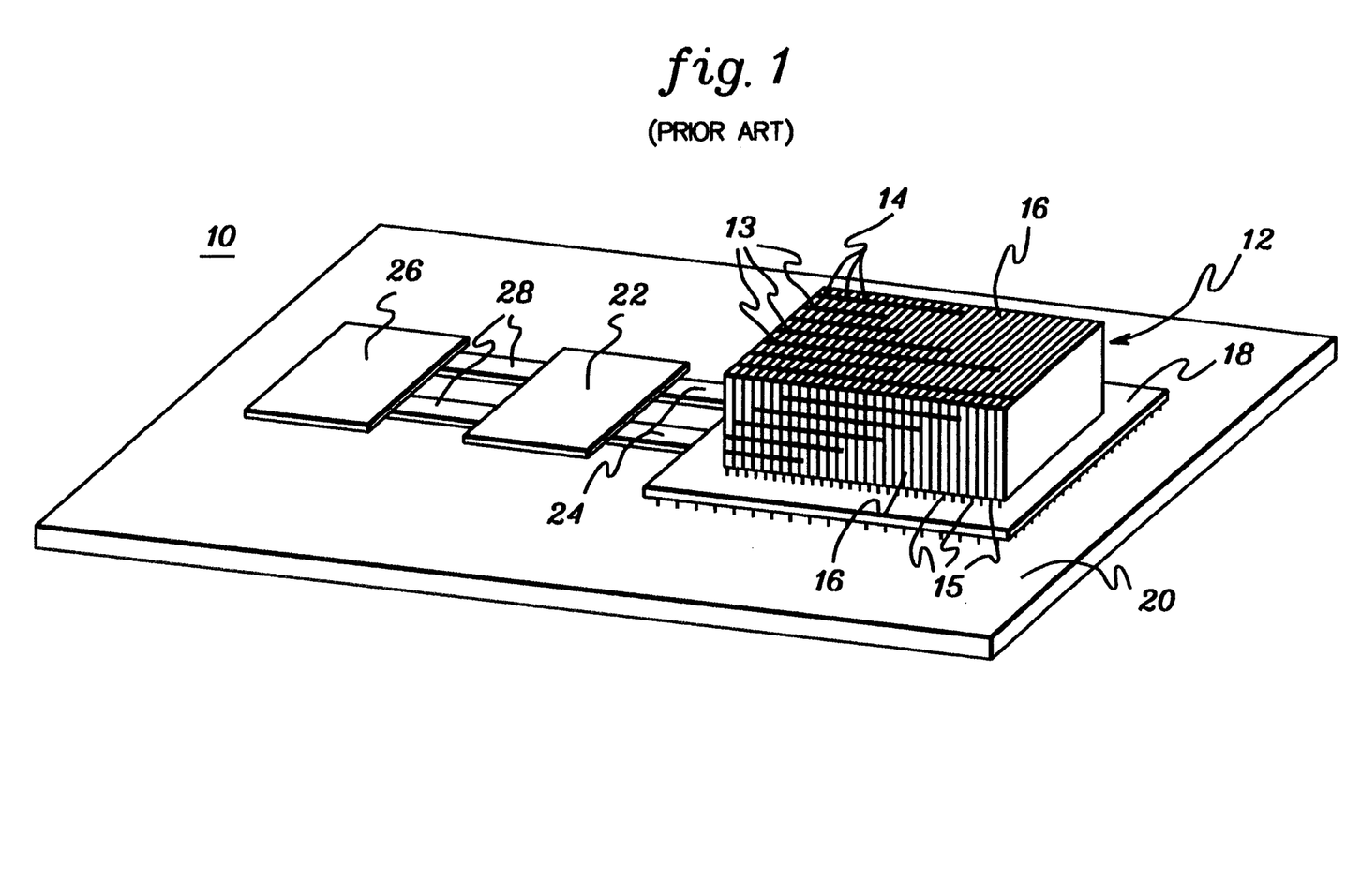
FIG. 1 is a perspective view of a portion of a prior art circuit utilizing a memory stack comprising a multiplicity of semiconductor chips.

One example of a state of the art multichip system, generally denoted 10, is shown in FIG. 1. System 10 utilizes a memory stack 12 which comprises a multiplicity of layers 14, each of which is a semiconductor chip (preferably silicon) having an integrated circuit therein and suitable electrical leads (not shown) terminating in one or more side surfaces 16. Stack 12 is, in effect, a sandwich comprising numerous silicon chips, or substrates, secured together by suitable adhesive material between adjacent chips.

In the embodiment shown, the stack shape may be described as rectangular parallelpiped because each of the chips therein is rectangular. In some cases the stack may be essentially cubic or, alternatively, cylindrical. The lower side surface of stack 12 has a plurality of electrical contacts 15 for electrically coupling to a memory stack carrier 18 which resides on a card 20. Also mounted to card 20 is a memory controller chip 22 which communicates with memory stack 12 through a memory bus 24 (and pad transfer contacts (not shown) on carrier 18). Card 20 typically supports numerous other conventional circuitry, such as a central processing unit 26, which communicates with memory controller 22 via a CPU bus 28.

One or more of the side surfaces of memory stack 12 is typically planar to facilitate connection of the integrated circuitry on the chips (and in particular the electrical leads extending therefrom to the at least one side surface) to electrical conductors 13 along the side surface of the package. Planar side surface wiring can be provided by a conventional photolithographic metal deposition and etching process. In most applications, the planar side wiring is in the form of stripes (or buses) 13 extending perpendicular to the planes of the chips. Each of the stripes crosses the interfaces between a plurality of chips where it makes electrical contact with electrical conductor leads on the chips. This perpendicularity of stripes to chips is recognized as useful because it ensures contact of the wiring stripes with the appropriate conductor leads regardless of differences (i.e., tolerances) in the thickness of the chips.

Traditionally, T-shaped electrical junctions (not shown) are formed in the access plane, i.e., the at least one planar side surface 16 of the stack having the pattern of connecting metallization thereon, to provide good electrical junctions with the leads brought out to that side surface from the respective integrated circuit chips 14. This is accomplished by depositing conductor pads on top of the access plane such that each pad intersects and connects with an end of an electrical lead brought out from the respective integrated circuit chips 14. Again the pattern of metallization, which is formed on the side access plane by any suitable technique, such as photo- delineation followed by etching, typically includes a plurality of conductor stripes 13 (i.e., buses), each of which overlies and is in contact with the appropriate group of leads on the side access plane. For further information on the state of the art of multichip packaging, reference should be made to U.S. Pat. No. 4,525,921, entitled "High-Density Electronic Processing Package structure and Fabrication," which is hereby incorporated herein by reference.

Figure 2:
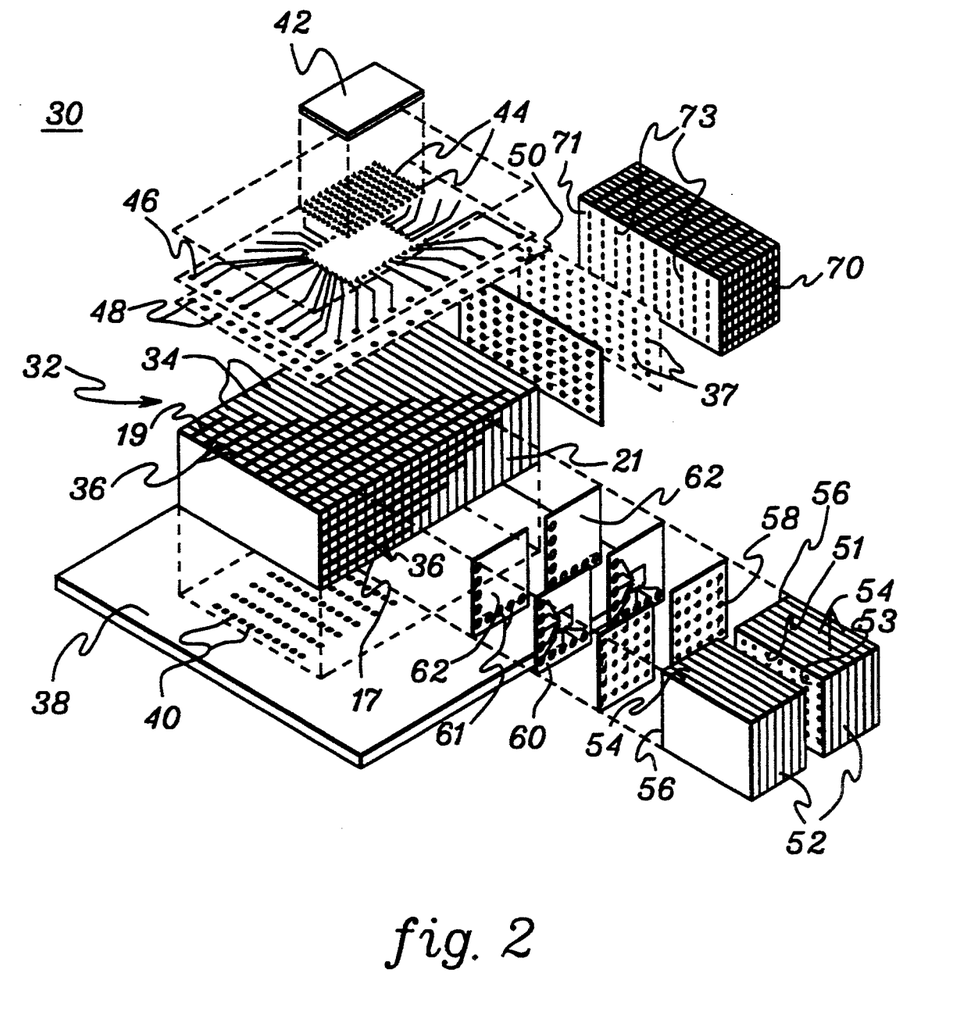
FIG. 2 is an exploded perspective view of one example of a system of multichip integrated circuit packages pursuant to the present invention.

With the above as background, one aspect of the present invention comprises a system having multiple integrated circuit chip packages directly coupled together, with significantly reduced lead lengths in comparison with those otherwise required to individually connect a multichip package to a circuit board such as depicted in FIG. 1. The fabrication techniques described herein allow for laminated chip modules of various sizes to be directly interconnected. Further, each package may include combinations of RAMs, ROMs, logic, decoupling capacitors and other discrete components, and support circuitry, which when combined form a system of multiple laminated chip packages. Also, each laminated chip package, as well as the individual chips therein, may be formed from various technology types, e.g., CMOS, Bipolar, BiCMOS, etc. One example of a system of multiple laminated chip packages is shown in FIG. 2.

The multiple chip package system, denoted 30, includes a first rectangular parallelpiped module 32, which again comprises a multiplicity of semiconductor chip layers 34. By way of example, module 32 may include multiple parallel processing units, along with supporting ROM, cache, cache control, tag, memory control, I/O control, etc. In this embodiment, at least three side surfaces 17, 19 and 21 of the module define planar access surfaces, on each of which chip interconnecting metallization patterns are disposed, such as the linear metallizations 36 on surfaces 19 and 21.

Various side surface metallization patterns for interconnecting semiconductor chips 34 of module 32 are possible. However, linear or "bus" interconnections are common to most applications. The significant drawback to side surface metallization as shown is that bus interconnections 36 drastically reduce the area available for other types of connections, either to another multichip package or between chips of the same package (e.g., discrete or non-linear patterned connections). One skilled in the art will recognize that not all of the conductors brought to the side surface of the chips need to be completely bused together. The extent busing depends upon the particular package and the types of integrated circuit chips laminated therein.

As shown in the figure, side surface 17 of multichip module 32 resides on a substrate 38 (e.g., ceramic) and is electrically connected to a pattern of metallization thereon (not shown) via electrical connectors (e.g. solder bumps) 40. In one processing embodiment, the higher eutectic temperature solder bumps are used between access surface 17 of module and substrate 38, i.e., assuming module 32 and substrate 38 are the first structures to be connected in the system. Progressively lower temperature solder bumps are then respectively positioned on all other access planes of the multichip packages as the system is assembled. A lower eutectic temperature is required in subsequent assembly stages to prevent solder-bumps on other packages from becoming liquid. Also, provision may be made to minimize the effects while processing is being completed. For example, it may be necessary to include outrigger solder bumps to prevent tilting of module 32 relative to the substrate.

Side surface 19 of module 32 receives a single integrated circuit chip 42 (e.g., for self-test of the module, Field replaceable unit (FRU) enhance, redrive, ECC, etc.), which is electrically coupled thereto, for example, via conventional solder bumps 44, and pad transfer metallization 46 disposed between via holes 48 in an insulating layer 50 (e.g., polyimide) overlying surface 19. Insulating layer 50 separates pad transfer metallization 46 from the pattern of metallization 36 on side surface As shown, system (or subsystem) 30 contains several directly coupled multichip packages, e.g., module 32, and modules 52 and 70. As with module 32, each module 52 has a multiplicity of layers 54, each of which comprises a semiconductor chip having an integrated circuit therein and suitable electrical leads extending therefrom and terminating in at least one side surface, e.g., side plane 56. Modules 52 are electrically connected to planar side surface 21 of module 32 via electrical connectors (e.g. conventional solder bumps) 58 overlaid on an appropriate pad transfer metallization 60 which is disposed on an insulating layer 62 (e.g., a layer of polyimide). Layer 62 has via holes 61 therein which allow electrical contact to the underlying pattern of metallization 35 on the module's side surface 21. Pad transfer metallization 60 forms conductor paths to this pattern of metallization on module 32 to match the connections required by laminated chip modules 52. By directly connecting module 32 and modules 52 as depicted, interconnecting lead lengths therebetween are significantly reduced in comparison with connection lengths otherwise resulting from a more conventional circuit approach wherein a circuit board is employed to support the interconnections. (Additionally, modules 52 may be directly coupled together, for example, via metallization 51 on adjoining end surfaces 53 using a technique described below.)

As noted above, multichip packages of various sizes can be interconnected. This capability can provide for improved silicon utilization. Further, chips in a single multichip package may be differently sized. In most embodiments, the only requirement is that at least one side surface of the module be planar, which is to facilitate disposition of linear metallization patterns (buses) thereon. An alternative approach is to force all chips in a multichip package to De the same size, in which case the size of the overall package is governed by the size of the largest individual chip contained therein. By directly connecting differently sized chip packages together, the present invention allows overall chip silicon real estate to be optimized.

Because of the improved circuit density in a system of directly interconnected multichip packages, additional functions can be added which could not otherwise be considered. Further, by directly interconnecting multiple packages the reworkable unit size is more reasonable. For example, if a problem arises, then only the individual package with the problem needs to be reworked. In addition, directly combining individual modules allows for better busing and improved signal transmission characteristics. A subsystem having multiple laminated chip packages contains fewer module-to-board-to-module interfaces. This improves signal propagation delay times and, because of the reduce lead lengths, inductance noise and capacitive loading effects. By combining multiple functions in several interconnected multichip modules, it is conceivable that an entire system, including processor, hierarchical memory (with ECC), memory controller, serial and parallel I/O ports, etc., can be supported as a single unit.

As a further system enhancement, filter capacitors can be attached either within a multichip package or as a subassembly of the whole system. Power supply filtering, which is usually a problem in large circuit board systems, can be accomplished pursuant to the present invention by using either chip capacitors (e.g., trench) or thin-film capacitors. Chip capacitors can be designed to be interposed within an individual multichip package, while thin film capacitors can be incorporated into the system using the multiple laminated chip packaging concept. In addition, self-test modules or chips can be included within the assembly in order to greatly improve testability. This may include micro coded ROMs, microprocessors and control circuitry to provide diagnostic support in the system. The self-test circuitry may allow programming of the system to automatically allocate/deallocate memory as required by self-test analysis. Other useful information could be gathered in registers accompanying such a device to help a field engineer to determine the cause of a system problem. Further, redrive capability can be provided within an assembly in order to reduce the current drive requirements needed from within the multichip package (i.e., from chip-to-chip) as well as external drive requirements (from multichip package to multichip package).

Figure 3:
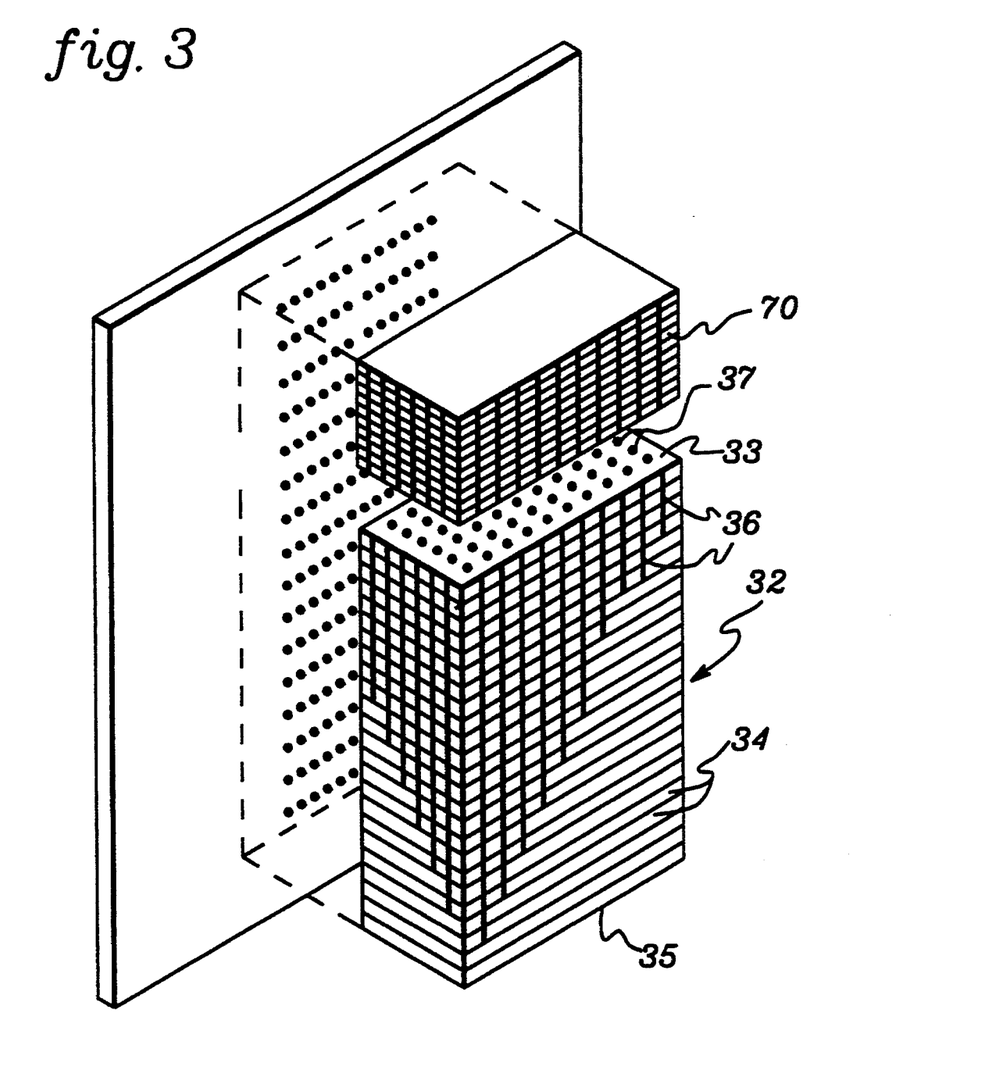
FIG. 3 is an exploded perspective view of two of the multichip integrated circuit packages of FIG. 2.

Referring now to FIG. 3, an exploded view is shown of multichip module 32 and a separate multichip integrated circuit module 70, which is connected to an end surface 35 of module 32. (Similar to modules 32 and 52, module 70 has a plurality of layers each of which preferably comprises a semiconductor chip.) The end surfaces of modules 32 and 70 are unique surfaces in that they are each clean surfaces, i.e., contain no conductor leads from the semiconductor chip layers within the stack. These surfaces can support an area array of contact pads, such as the array of solder bumps 37 depicted on end surface 33 of module 32, and may include active circuitry. Module 70 also includes an end surface 71 having an area array of connect pads 73 (FIG. 2), which preferably correspond to the area array of contact pads 37 on end surface 33 of module 32 to facilitate electrical interconnection of modules 32 and 70.

This ability to form area array contacts on the end surfaces of the multichip modules is significant. Most, if not all, prior multichip stacks have restricted the formation of connections to external signal sources to contacts on a side surface thereof. This restriction substantially limits the ability to connect a multichip package to various external signal sources (and in particular to another multichip package). This is because the side surfaces of a laminated chip package are typically reserved for linear metallizations (buses), which are required to interconnect the conductors brought out to the respective surface from the semiconductor layers within the stack, and/or for thermal coupling of the package to a neat sink for dissipating thermal energy generated therein.

By comparison, the end surfaces of a multichip package can each include a large number of separate connect pads. For example, if it is assumed that a multichip package has a cubic configuration and that the planar side surfaces thereof can accommodate up to 100 linear buses, then the end surfaces of the package could accommodate a 100 by 100 area array of connects, i.e., 10,000 independent connects. Obviously, such an area array capability greatly enhances the interconnectability of the package to one or more multichip packages and/or a supporting circuit board. The possible density of connects on the end surfaces is proportional to the dimensions of the stack and, in particular, to the surface area of the end semiconductor chips in the stack. Pursuant to the present invention, the end surfaces of the multichip package can be used in a significantly different way than the side surfaces thereof, which (as noted) by design typically receive metallization for interconnecting the conductors from the various semiconductor layers comprising the package, along with providing interface surfaces for neat dissipation. The number of possible external interconnects can be several orders of magnitude greater than that obtainable using just the side surfaces, which again is believed significant to facilitating interconnection between multiple multichip packages.

Figure 4:
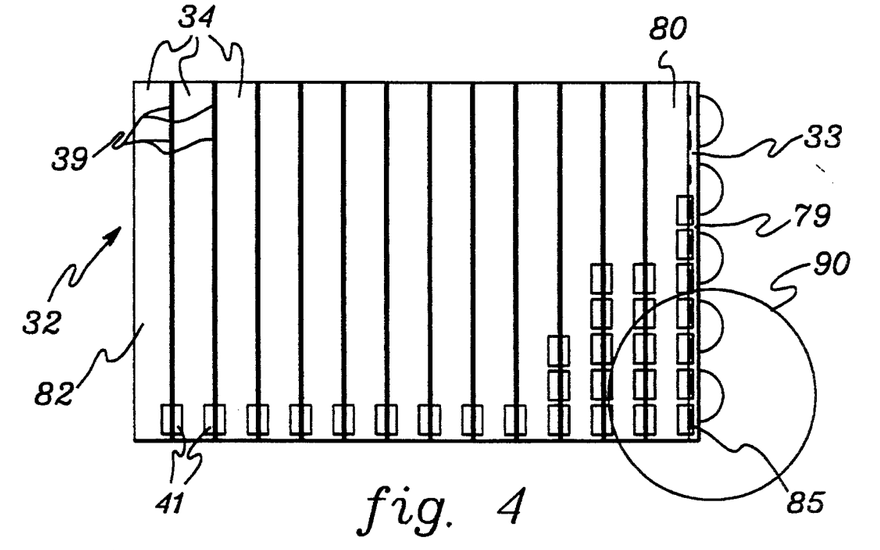
FIG. 4 is a partial plan view of one of the multichip packages of FIGS. 2 and 3.

Referring now to FIG. 4, which is a plan view of a partially complete multichip package, such as package 32 of the previous figures. As shown, a plurality of conductors 39 are typically brought to one or more of the side surfaces of the package. Conductors 39 can comprise any conventional integrated circuit metallization, e.g., leads sandwiched between electrical insulating layers (not shown) disposed between adjoining chips. Typically, multiple leads are brought out from each integrated circuit chip in the stack. A unique connect pad 41 is preferably disposed over the end of each conductor 39 so as to provide good electrical connection therewith, thereby forming a T-connect pad. The T-connect pads, ensure good electrical contact between the conductors of the integrated circuit chips and the overlying layer of metallization (not shown). In most implementations, the T-connects are bused together to provide chip interconnections (see, e.g., metallizations 36 (FIG. 2)).

Figure 5:
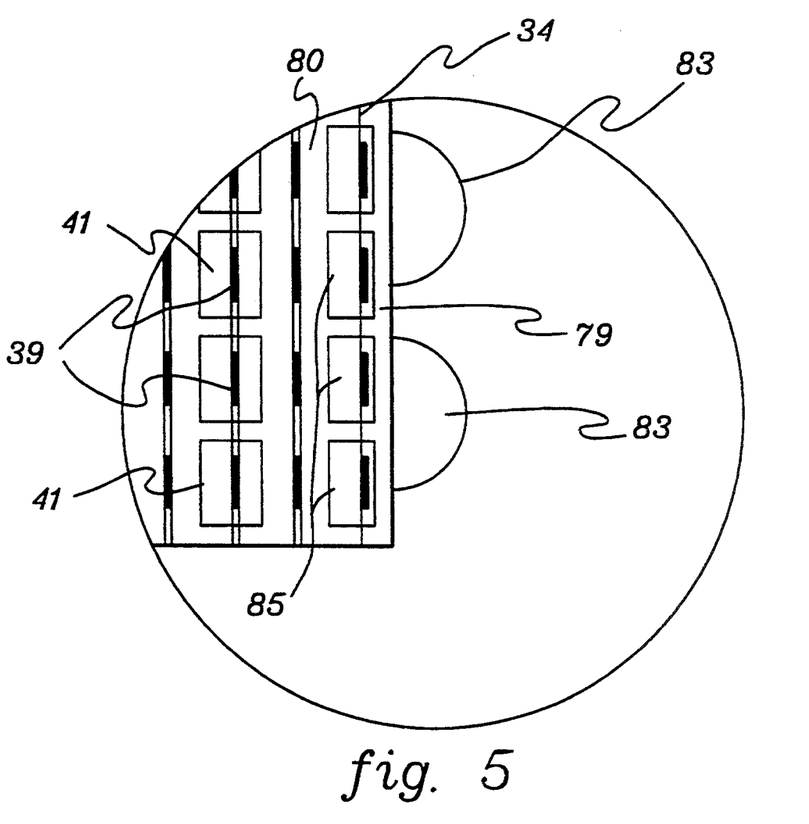
FIG. 5 is an enlarged plan view of a corner of the multichip package of FIG. 4.

Another feature of the present invention is the use of active integrated circuit chips at one or both of the end surfaces of the multichip package, such as chip 80 and 82 shown in. FIGS. 4 and 5. In most prior multichip packages, these end chips nave comprised blank or "dummy" chips, provided merely to facilitate the creation of T-connect pads over the conductors brought out to the side surfaces from the chips next adjacent thereto. As shown in FIGS. 4 and 5, pursuant to the invention active end chip 80 has a relatively thick 10–20 micrometer layer 79 of a dielectric material, such as a polyimide. Contact connections on end surface 33 (for example, solder bumps 83) can be electrically coupled to any conductor or T-connect on one or more of the side surfaces of the package by providing appropriate patterns of metallization disposed beneath (or within) insulating layer 79 between selected metallized vias (not shown) therein (within which solder bumps 83 reside) and the desired side surface(s) of the multichip package. Such an end pattern of interconnecting metallization can be provided using available patterning and metallizing techniques.

As best shown in FIG. 5 (expanded view of area 90 of FIG. 4), since insulating layer 79 is substantially thinner than the semiconductor chip layers of the package (e.g., one tenth the size), special T-pads 85 are formed in association with the conductors extending from the semiconductor chip 80 adjacent the end surface of the package. T-pad connects 85 on the end of the package are sufficiently sized to allow linear metallizations to readily connect thereto. Relatively thick insulating layer 79 provides an adequate landing surface for the disposition of these specialized pads, which form T-connects 85. As shown, each T-connect pad 85 has first and second coplanar portions, wherein the first portion overlies an edge surface of an end integrated circuit chip; and the second portion extends slightly from the first portion towards the end of the module and beyond the edge surface of the integrated circuit chip.

These techniques for interconnecting some or all of the conductors on the end surfaces and the side surfaces of the package makes possible the use of dissimilar buses on the various surfaces thereof. For example, a bus on a side surface can provide wiring between various chips in the middle of the package and metallization on the end surface of the package, while another bus on the end surface can contain a solder bump array of connections for coupling the multichip package with a higher level package assembly. By way of example, such flexibility could greatly simplify the addition of a memory controller chip to a memory package. The resulting structure in essence becomes a subsystem that can interface directly with a separate multichip package.

It will be observed from the above description that a multichip package and a system of multichip packages having reduced integrated circuit chip lead lengths nave been set forth. The reduced lead lengths advantageously result in reduced lead inductance noise, capacitive loading effects, signal propagation delays and signal skews. In addition, using the package and system approaches described, drivers and receivers can be physically placed closer to each other than with any previously known packaging technique.

While the invention has been described in detail herein in accordance with certain preferred embodiments thereof, many modifications and changes therein may be effected by those skilled in the art. Accordingly, it is intended by the appended claims to cover all such modifications and changes as fail within the true spirit and scope of the invention.

What is claimed is:

1. A multichip integrated circuit package having metallization configured to facilitate electrical connection thereof to an external signal circuit, said package comprising:

a plurality of integrated circuit chips each having two substantially parallel planar main surfaces and an edge surface, one of said substantially parallel planar main surfaces of at least some of said integrated circuit chips comprising an active surface of said integrated circuit chip, said plurality of integrated circuit chips being connected to form a unitized module having at least one side surface and at least one end surface, said at least one side surface of said unitized module being at least partially defined by the edge surfaces of said plurality of integrated circuit chips forming said unitized module, and said at least one end surface of said unitized module extending substantially parallel to a planar main surface of an end one of said plurality of integrated circuit chips forming said unitized module, at least some of said plurality of integrated circuit chips including conductive leads extending to said at least one side surface of said unitized module, said package further including a first metallization pattern disposed directly on at least one side surface of said unitized module for electrically connecting at least some of said chip leads extending thereto, a second metallization pattern disposed directly on said at least one end surface of said unitized module and configured to facilitate electrical connection between said package and the external signal circuit, and interconnection means for electrically interconnecting said first metallization pattern and said second metallization pattern, said interconnection means comprising: at least one T connect pad on said at least one side surface, said at least one T connect pad having first and second coplanar portions, said first portion overlying an edge surface of an end integrated circuit chip of said plurality of integrated circuit chips, said second portion extending from said first portion towards said at least one end surface of said unitized module and beyond the edge surface of said end integrated circuit chip, and an end metallization pattern connecting said at least one T connect pad to the second metallization pattern.

2. The multichip integrated circuit package of claim 1, wherein said unitized module has four side surfaces, at least one of said four side surfaces being planar, said at least one planar side surface having said first metallization pattern disposed thereon.

3. The multichip integrated circuit package of claim 2, wherein each of said side surfaces of said unitized module is planar.

4. The multichip integrated circuit package of claim 3, wherein each of said integrated circuit chips of said unitized module has planar surfaces and a rectangular shape.

5. The multichip integrated circuit package of claim 4, wherein at least some of said integrated circuit chip conductive leads extend to different side surfaces of said unitized module, and wherein said first metallization pattern includes a separate metallization pattern on each of said side surfaces having said conductive leads extending thereto, each of said separate metallization patterns being configured to electrically connect at least some of said chip leads extending thereto.

6. The multichip integrated circuit package of claim 1, wherein said end metallization pattern is disposed at least partially between the end integrated circuit chip and a dielectric layer, said dielectric layer having a plurality of via holes therein and said second metallization pattern disposed on an outer main surface thereof, said end metallization pattern occupying at least one of said via holes for electrically connecting said at least one T connect pad with said second metallization pattern, and said second portion of said at least one T connect pad overlying an edge surface of said dielectric layer.

7. The multichip integrated circuit package of claim 6, wherein said dielectric layer comprises a polyimide.

8. The multichip integrated circuit package of claim 6 wherein a plurality of such T connect pads are disposed on said at least one side surface of said unitized module having said first metallization pattern, at least some of said T connect pads being electrically connected to said first metallization pattern, and wherein said end metallization pattern electrically connects with at least one of said T connect pads electrically connected to said first metallization pattern.

9. The multichip integrated circuit package of claim 6, wherein the end integrated circuit chip comprises an active integrated circuit chip having an active device, and said end metallization pattern connects said at least one T connect pad to said second metallization pattern through said active device.

10. The multichip integrated circuit package of claim 1, wherein said first metallization pattern includes a plurality of linear electrical connections and said second metallization pattern includes an area array of electrical connections.

11. The multichip integrated circuit package of claim 10, wherein said second metallization pattern comprises an area array of solder bump connections, and said first metallization pattern further comprises connection means for directly connecting said package to a second external signal circuit along said at least one side surface.

12. A multilayer integrated circuit package having metallization configured to facilitate electrical connection thereof to an external signal circuit, said package comprising:

a plurality of layers each having two substantially parallel planar main surfaces and an edge surface, said plurality of layers being connected to form a unitized module having at least one side surface and at least one end surface, said at least one side surface of said unitized module being defined by said edge surfaces of said plurality of layers forming said unitized module, and said at least one end surface of said unitized module comprising an outer planar main surface of an end dielectric layer of said plurality of layers forming said unitized module, at least some of said plurality of layers including an integrated circuit chip with conductive leads extending to said at least one side surface of said unitized module, said package further including a first metallization pattern disposed directly on said at least one side surface of said unitized module for electrically connecting at least some of said chip leads extending thereto, a second metallization pattern disposed directly on said at least one end surface of said unitized module and configured to facilitate electrical connection between said package and the external signal circuit, and interconnection means for electrically interconnecting said first metallization pattern and said second metallization pattern, said interconnection means comprising: at least one T connect pad on said at least one side surface, said at least one T connect pad having first and second coplanar portions, the first portion overlying an edge surface of a penultimate layer of said plurality of layers, and the second portion overlying an edge surface of said dielectric layer, and an end metallization pattern at least partially sandwiched between the penultimate layer and the dielectric layer connecting said at least one T connect pad to the second metallization pattern through a metal filled via in said dielectric layer.

13. The multilayer integrated circuit package of claim 12 wherein the dielectric layer is substantially thinner than the penultimate layer, and the second portion of said T connect pad is substantially narrower than the first portion of said T connect pad.

14. The multilayer integrated circuit package of claim 13 wherein said penultimate layer includes an active integrated circuit device, and said end metallization pattern connects said at least one T connect pad to said second metallization pattern by way of said active integrated circuit device.

15. The multilayer integrated circuit package of claim 13 wherein said first metallization pattern further comprises connection means for electrically connecting said package to a second external signal circuit along said at least one side surface.

16. A multichip integrated circuit package having metallization configured to facilitate direct electrical connection thereof to plural external signal circuits, said package comprising:

a plurality of integrated circuit chips each having two substantially parallel planar main surfaces and an edge surface, one of said substantially parallel planar main surfaces of at least some of said integrated circuit chips comprising an active surface of said integrated circuit chip, said plurality of integrated circuit chips being connected to form a monolithic module having at least one side surface and at least one end surface, said at least one side surface of said monolithic module being at least partially defined by the edge surfaces of said plurality of integrated circuit chips forming said module, and said at least one end surface of said module extending substantially parallel to a planar main surface of an end integrated circuit chip of said module, at least some of said plurality of integrated circuit chips including conductive leads extending to said at least one side surface of said module, said package further including a first metallization pattern disposed directly on said at least one side surface of said module for electrically connecting at least some of said chip leads extending thereto and for electrically connecting said package to a first external circuit along said at least one side surface, and a second metallization pattern disposed directly on said at least one end surface of said module and configured to facilitate electrical connection between said package and a second external signal circuit; and interconnection means for electrically interconnecting said first metallization pattern and said second metallization pattern, said interconnection means comprising: at least one T connect pad overlying an edge surface of the end integrated circuit chip on said at least one side surface, and an end metallization pattern sandwiched at least partially between said end integrated circuit chip and a dielectric layer, said dielectric layer having a plurality of via holes therein and said second metallization pattern disposed on an outer main surface thereof, said end metallization pattern occupying at least one of said via holes for electrically connecting said at least one T connect pad with said second metallization pattern.

17. The multichip integrated circuit package of claim 16 wherein said at least one T connect pad comprises a first portion overlying an edge surface of said end integrated circuit chip and a second portion overlying an edge surface of said dielectric layer.

18. The multichip integrated circuit package of claim 17 wherein said second portion of said at least one T connect pad is narrower than said first portion.

19. The multichip integrated circuit package of claim 17 wherein said end integrated circuit chip comprises an active integrated circuit device connected to said end metallization pattern.

20. The multichip integrated circuit package of claim 16 in combination with said first and second external signal circuits, at least one of said first and second external signal circuits comprising another multichip integrated circuit package having a first metallization pattern on at least one side surface and a second metallization pattern on at least one end surface.

21. The multichip integrated circuit package of claim 16 wherein connection means of said first metallization pattern serving to electrically connect said package to said first external circuit has a different eutectic temperature than connecting means of said second metallization pattern serving to electrically connect said package to said second external signal circuit.

* * * * *